United States Patent [19]

Harland, Jr. et al.

[11] 3,755,722

[45] Aug. 28, 1973

[54] RESISTOR ISOLATION FOR DOUBLE MESA TRANSISTORS

[75] Inventors: Glen E. Harland, Jr.; Robert W. Metzger, Jr., both of Kokomo, Ind.

[73] Assignee: General Motors Corporation, Detroit, Mich.

[22] Filed: Sept. 28, 1972

[21] Appl. No.: 292,979

[52] U.S. Cl...... 317/235 R, 317/235 E, 317/235 AK

[51] Int. Cl. .......................................... H01l 19/00

[58] Field of Search................. 317/234, 40.13, 47.1

[56] References Cited

UNITED STATES PATENTS 3,624,454 11/1971 Adkinson et al.................... 317/101

*Primary Examiner*—John W. Huckert

*Assistant Examiner*—E. Wojciechowicz

*Attorney*—George A. Grove and Robert J. Wallace

[57] ABSTRACT

A high voltage and high current mesa type integrated circuit of cascaded common collector mesa emitter transistors and bleeder resistors that resists secondary breakdown. Discrete input and output emitter mesas and base enhancement regions are provided with the output emitter mesa surrounded by an output base enhancement region. Both mesas are separately shorted to the output base enhancement region.

4 Claims, 5 Drawing Figures

RESISTOR ISOLATION FOR DOUBLE MESA TRANSISTORS

BACKGROUND OF THE INVENTION

This invention relates to semiconductor devices and more particularly to integrated circuit devices of the mesa type. It is especially directed to a mesa emitter integrated Darlington amplifier having integral bleeder resistors.

Mesa type Darlington amplifiers can readily be constructed to possess a high energy capability with a low collector-emitter saturation voltage at high current levels. An emitter-base current path, through an appropriate resistance, is often provided for each transistor stage in a Darlington amplifier to bleed off leakage current that appears when the circuit is operated at higher temperatures. This gives the circuit higher temperature stability.

In mesa devices, the emitter-base and base-collector junctions do not terminate at the same surface of the device, as occurs in planar devices. Mesa devices can be made with a planar type emitter region or a mesa emitter on a base mesa. This invention is directed to mesa emitter type devices having integral bleeder resistors.

Mesa devices can be used in a given circuit to allow the circuit to handle higher voltages, higher currents, or both. For example these devices can handle currents of 3 amperes and more at more than 100 volts. However, such devices cannot be readily integrated. The usual integrated circuit technology is primarily directed to planar devices. Special techniques and processing have, therefore, been developed to facilitate incorporation of mesa type devices in an integrated circuit. One such special technique involves electrical isolation of discrete mesa devices in an integrated circuit, that still permits one to use conventional mesa type triple diffusion technology to make the circuit. Isolation is achieved by the use of etch moats that circumscribe selected areas to be isolated. The etch moats extend down through the base-collector junction. This not only isolates devices but can be used to concurrently form a base region mesa. Unfortunately, such structures require jumper wires to electrically bridge the moats. Moreover, peculiar extended moat configurations are needed to define integral resistors for the circuit, if the whole circuit is to be made by the conventional triple diffusion technology normally used to make mesa devices. The use of jumper wires is, of course, undesirable from a cost and reliability standpoint. Also, the length of exposed base-collector junction is increased by the extended moat configurations. This increases the probability for secondary breakdown of this junction, which limits the voltage capability for the circuit.

U.S. Pat. No. 3,624,454 Adkinson et al. discloses an integrated mesa emitter type Darlington amplifier that has integral bleeder resistors formed with a reduced etch moat length and that does not require jumper wires. Adkinson et al provide the bleeder resistors by a peculiar arrangement of short etch moats encroaching within active portions of the device from a circumscribing etch moat. Conventional planar type surface metallization is all that is required to interconnect the active devices with the integral bleeder resistors. Hence, etch moat length is reduced and jumper wires are eliminated.

We have found that bleeder resistors for this type of device can be defined without the use of even short etch moats. This is achieved by extending emitter mesas completely across the active surface of the base layer of a semiconductor wafer between a circumscribing etch moat. Unfortunately, this approach alone does not increase the current and voltage handling capabilities of the device enough. It appears that the areas where the emitter mesa intersects the edge of a wafer, or intersects an etch moat, are more susceptible to secondary breakdown, particularly on the output stage of a Darlington amplifier. Thus, use of extended emitter mesas can eliminate the need for short etch moats. However, it does so by introducing regions more susceptible to secondary breakdown. While there is some benefit in using this approach on the input stage of a Darlington amplifier, it offers no significant benefits when used on the output stage.

We have now found a way to make this type of device by the usual triple diffusion techniques for mesa devices that does not concurrently introduce other weaknesses into the output stage. In addition, we have found that by also using oxide masking techniques we can produce a unique integrated structure of this device in which such weaknesses are not introduced into either stage. Thus, some of the benefits of this invention can be attained in a new structure requiring only the usual triple diffusion techniques. The fullest voltage and current improvement, however, is obtained if this invention is applied to both stages of the amplifier, which also requires use of oxide masking techniques.

OBJECTS AND SUMMARY OF THE INVENTION:

An object of this invention is, therefore, to provide an improved mesa emitter type integrated Darlington amplifier with integral bleeder resistors. A further object of this invention is to provide such a structure that can be made using only the usual triple diffusion techniques for making mesa devices. A still further object of the invention is to provide an even more improved mesa emitter type integrated Darlington amplifier structure that can be made using oxide masking techniques in addition to the usual triple diffusion processing.

These and other objects of the invention are achieved using a semiconductor wafer of one type conductivity, having a surface stratum of opposite conductivity type with discrete lower resistivity input and output base enhancement surface regions of that opposite conductivity type. Two discrete emitter mesas of the one type conductivity are disposed on the base stratum adjacent the enhancement regions. The output emitter mesa is completely surrounded by the output base enhancement region. Both the input and output emitter mesas are separately electrically shorted to the output base enhancement region. The first short provides a high resistance input bleeder resistor between the two base enhancement regions through the surface stratum of opposite conductivity type. The second short provides a low resistance output bleeder resistor along a portion of the output base enhancement region.

DESCRIPTION OF THE DRAWING

Other objects, features and advantages of this invention will become more apparent from the following description of the preferred examples thereof and from the drawings, in which.

Figure 1:
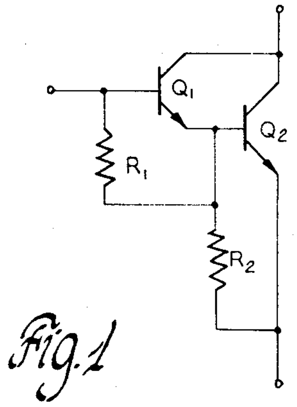
FIG. 1 is an electrical schematic showing a Darlington amplifier circuit having bleeder resistors.

DESCRIPTION OF THE PREFERRED EMBODIMENTS:

As can be seen in connection with FIG. 1, this invention is particularly directed to an integrated Darlington amplifier having an input transistor $Q_1$ and an output transistor $Q_2$. It also includes a relatively high resistance input bleeder resistor $R_1$ for input transistor $Q_1$ and a relatively low resistance output bleeder resistor $R_2$ for output transistor $Q_2$. $R_1$ should have a greater resistance than $R_2$ to insure that $Q_1$ will turn on before $Q_2$, and at the desired base drive. For higher voltage applications $R_1$ can be about 100–600 ohms and $R_2$ about 10–150 ohms.

Figure 2:
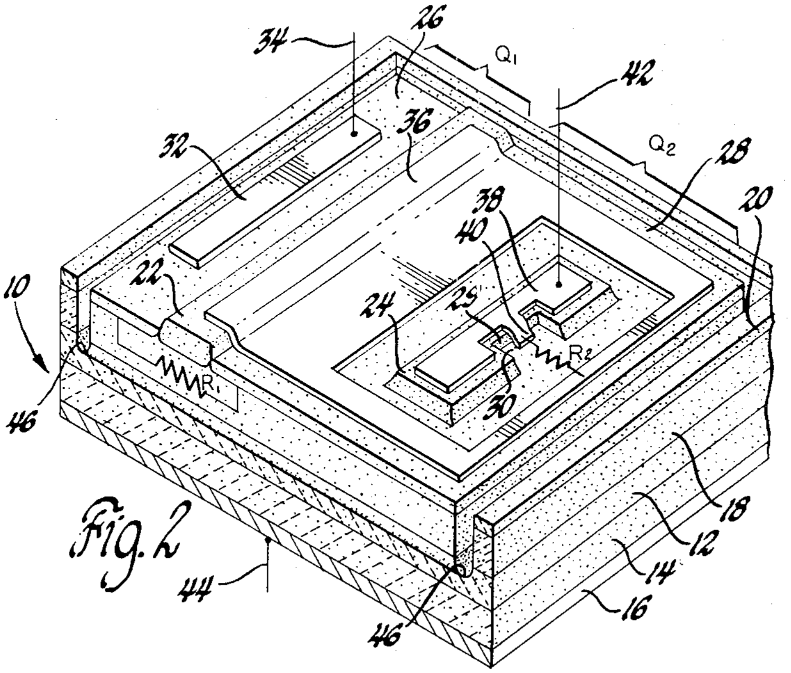
FIG. 2 is an isometric view in partial section showing a rudimentary mesa emitter type Darlington amplifier with integral bleeder resistors in which the output emitter mesa does not intersect a moat edge.

FIG. 2 shows the FIG. 1 circuit as an integrated device in a mesa emitter type of structure. It is shown in rudimentary form for purposes of illustration. The device is formed on a wafer 10 of high resistivity N-type silicon. By high resistivity N-type silicon we mean a high purity silicon material that is doped with an N-type conductivity determining impurity at a concentration of less than about $10^{15}$ atoms per cubic centimeter of silicon. The wafer 10 has major surface dimensions of about 175 by 175 mils and is about 8.5 mils thick. It has a plurality of diffusion strata and regions which are shown in exaggerated thicknesses for purposes of illustration. The thickest of these is the undiffused original wafer material which forms a 4.0 mil thick central high resistivity N-type stratum 12. Central stratum 12 is of 0.5 – 100 ohm-centimeter N-type silicon. The lower surface of wafer 10 is formed by a lower resistivity N-type diffusion layer, or N+ stratum 14, about 0.9 mil thick and having a sheet resistance of about 0.48 ohm per square. This stratum is included to reduce contact resistance to stratum 12, and can be made by phosphorus diffusion. The N+ stratum 14 is covered with a metallic coating 16 to facilitate making a low resistance, ohmic connection to N+ stratum 14. Metallic coating 16 can be of nickel, solder, gold, etc.

The top surface of wafer 10 includes a P-type diffusion layer, or P-type stratum 18, and a shallower lower resistivity P-type diffusion layer 20 on selected portions of it. These layers can be formed by successive diffusion with impurities such as boron and aluminum. The shallower, lower resistivity layer 20 can be referred to as a P+ surface enhancement stratum. Stratum 18 is about 1.2 mils thick and has a sheet resistance at its interface with layer 20 of about 500 ohms per square. Surface enhancement stratum 20 is about 0.2 mil thick and has a sheet resistance of about 22 ohms per square.

N-type emitter mesas 22 and 24 upstand on the top surface of wafer 10. Mesas 22 and 24 are about 0.9 mil high and are doped by phosphorus or arsenic diffusions to a sheet resistance of about 0.48 ohm per square. Emitter mesa 22 extends entirely across the active surface of wafer 10, separating the wafer into base portion 26 for transistor $Q_1$ and base portion 28 for transistor $Q_2$. Emitter mesa 24 is completely surrounded by base portion 28 and the surface enhancement stratum 20 does not extend under either mesa. Mesa 24, the output emitter mesa, has a notch 29 in its side opposite from mesa 22 into which a part 30 of base portion 28 projects.

A metallization pattern on the surface of wafer 10 provides the electrodes and intraconnections for the device. The metallization can be formed by vacuum evaporation of aluminum in the normal and accepted manner. The base portion 26 for transistor $Q_1$ has an electrode 32, which is connected to a base input terminal 34. An electrode 36 on top of input emitter mesa 22 extends down off the mesa onto base portion 28 to completely surround output emitter mesa 24. This, of course, produces a low resistance electrical connection between the emitter of $Q_1$ and the base portion 28 of output transistor $Q_2$. However, it also concurrently provides an integral input bleeder resistor $R_1$ between base portion 26 and 28 through stratum 18 under emitter mesa 22.

Analogously, output emitter mesa 24 has an electrode 38 on its surface. A portion 40 of electrode 38 extends down off output emitter mesa 24 onto the part 30 of base portion 28 projecting into the notch 29 of mesa 24. As can be seen, electrode portion 40 is spaced from electrode 36 to provide an integral output bleeder resistor $R_2$ through the intermediate segment of surface enhancement layer 20 forming base portion 28. Since resistor $R_2$ is along the lower resistivity surface layer 20, resistor $R_2$ is easily adjusted to be of a lower value than resistor $R_1$, as is desired. Output emitter mesa electrode 38 is connected to an emitter terminal lead 42. A collector terminal lead 44 is connected to metallic coating 16 on the bottom of the wafer.

The entire device is circumscribed on its top surface by an etch moat 46 which elongated emitter mesa 22 intersects at each of its ends. Etch moat 46 extends down through the base-collector junction into central stratum 12. This construction is convenient from a processing standpoint in that it eliminates the need for oxide masking. The usual triple diffusion processing normally used to make mesa type devices are all that is needed to make this device. The input emitter mesa 22 intersects a moat but the output emitter mesa 24 does not. Hence, there is no special susceptibility to secondary breakdown associated with output transistor $Q_2$ and improved current and voltage characteristics are obtained.

Figure 3:
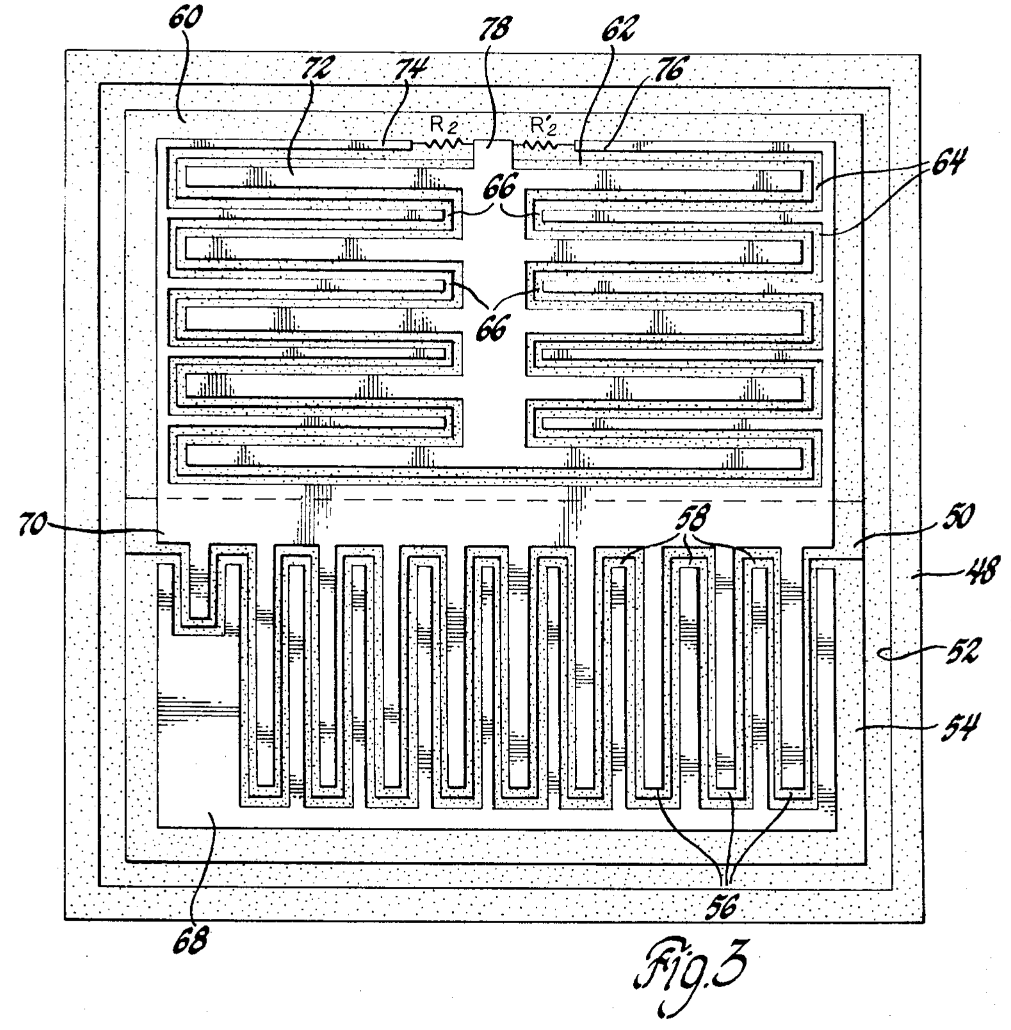
FIG. 3 is a plan view showing a more sophisticated device made along the lines of that shown in FIG. 2.

A device such as shown in FIG. 2 is normally made as an interdigitated structure to increase current gain. Such a structure is shown in FIG. 3. Accordingly, FIG. 3 shows essentially the same device as described in connection with FIG. 2 but in interdigitated form. It differs in one other respect too.

It shows that the output emitter mesa need not be notched in order to provide a suitable output bleeder resistance. The output bleeder resistance in FIG. 3 is provided by a pair of parallel resistors $R_2$ and $R_2'$. More specifically, FIG. 3 shows an N-type high resistivity silicon wafer 48 that has an elongated input emitter mesa 50 extending entirely across the active surface of the wafer between a circumscribing etch moat 52. As with etch moat 46 in FIG. 2, etch moat 52 extends down through the base-collector junction. Input emitter mesa 50 is interdigitated with input base portion 54, having projecting fingers 56. Input base portion 54 being interdigitated, with the input emitter mesa 50, has its own fingers 58.

Output base portion 60 completely surrounds and is interdigitated with output emitter mesa 62. This provides output emitter mesa fingers 64 and output base portion fingers 66. The electrodes for these regions are, of course, interdigitated also. Electrode 68 on input base region 54 is interdigitated with electrode 70 on input emitter mesa 50. Also, electrode 70 extends down onto output base portion 60, where it is interdigitated with electrode 72, which lies on top of output emitter mesa 50. However, electrode 70 only partially surrounds output emitter mesa 62, leaving free ends 74 and 76. Electrode 72 on top of output emitter mesa 62 has a portion 78 which extends down off the top of the mesa 62 onto base portion 60, similar to extension 40 in FIG. 2. The extension 78 of electrode 72 is spaced from the adjacent free ends 74 and 76 of electrode 70, to provide two parallel resistors $R_2$ and $R_2'$ which together serve as an output bleeder resistance. In this regard, the parallel output bleeder resistors $R_2$ and $R_2'$ are formed in a manner similar to that shown in connection with $Q_2$ in FIG. 5. Input bleeder resistance is provided in exactly the same way as it is provided in FIG. 2. Input bleeder resistance is provided between input and output base portions 54 and 60 through a surface base layer stratum beneath emitter mesa 50.

Figures 4, 5:
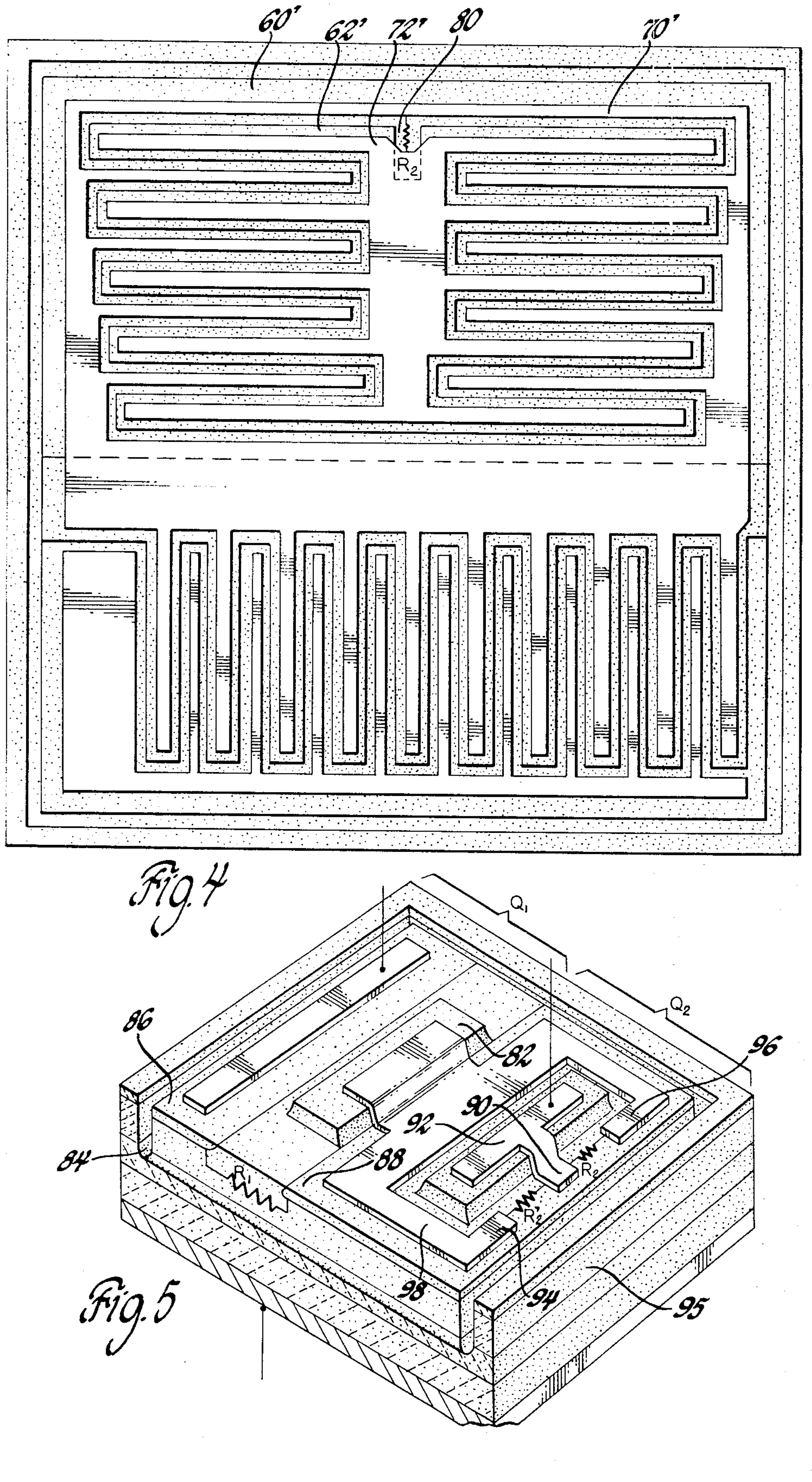
FIG. 4 is a plan view showing another embodiment of an interdigitated device made along the lines of the device shown in FIG. 2.
FIG. 5 is an isometric view in partial section showing still another embodiment of the invention, in which neither emitter mesa intersects a moat edge.

FIG. 4 is a plan view showing essentially the same type of interdigitated structure as described in FIG. 3. However, it differs with respect to the manner in which the output bleeder resistance is produced. Output bleeder resistance is formed with a single resistor, not a pair of resistors. An output emitter mesa notch is used, as in FIG. 2. However, electrode 72′ on top of output emitter mesa 62′ has no discrete extension down onto the base portion 60′ of the output transistor. In addition, electrode 70′ completely circumscribes output emitter mesa 62′, as electrode 36 does to mesa 24 in FIG. 2. Resistor $R_2$ is provided along a finger 80 of base portion 60′ in the emitter mesa notch. An integral portion of electrode 72′ extends down from the mesa 60′ onto finger portion 80, spaced from electrode 70′. This provides the output emitter-base short resulting in resistor $R_2$ along the interjacent segment of base finger 80.

As previously indicated, the devices shown in FIGS. 2, 3 and 4 are easily made without oxide masking by conventional triple diffusion techniques. With oxide masking avoided, such devices are more economical to manufacture. They are likely to be of high reliability since familiar existing processes can be used to make them. However, the input emitter mesa in these devices intersects a moat edge. Thus, these devices exhibit only a partial improvement in current and voltage characteristics that is available. For the highest improvement in such characteristics, neither the input nor the output emitter mesa should contact a moat or wafer edge. However, one must use oxide masking in addition to the usual triple diffusion techniques to make such a device. A rudimentary form of this latter device is shown in FIG. 5.

The device shown in FIG. 5 is essentially the same as that shown in connection with FIG. 2, differing essentially only in the shorter emitter mesa 82 and the parallel output resistors $R_2$ and $R_2'$. As can be seen, emitter mesa 82 is recessed from the surrounding moat 84. Hence, emitter 82 has no edge or end region that is especially susceptible to secondary breakdown. It is to be recognized, however, that when input emitter mesa 82 is recessed, it can no longer serve to define the region between input and output base portions 86 and 88, which forms resistor $R_1$. Oxide masking must now be used when these diffused surface enhancement regions are formed. Conventional oxide masking techniques can be used. However, such techniques can inherently increase the cost of the device through the additional processing steps and attendant yield losses. On the other hand, for special applications the additional current and voltage capabilities of this construction may readily justify the added manufacturing expense.

The output transistor $Q_2$ in FIG. 5 has two parallel resistors $R_2$ and $R_2'$. A portion 90 of output emitter mesa electrode 92 extends down onto output base portion 88 to provide the $Q_2$ emitter-base short. Portion 90 is spaced from the free ends 94 and 96 of electrode 98 on output base portion 88 an appropriate distance to provide parallel resistors $R_2$ and $R_2'$. Base enhancement regions 86 and 88 are spaced by means of the oxide masking to provide an integral input bleeder resistor $R_1$ through base stratum 95. In this connection, the input bleeder resistance is provided in essentially the same manner as shown in the preceding FIGS. 2 – 4, except that emitter mesa 82 does not intersect a moat edge and provide a region susceptible to secondary breakdown. Hence, the device can withstand even higher currents and voltages than the devices shown in FIGS. 2 – 4.

The foregoing examples describe a single NPN device formed on a silicon wafer. It is to be appreciated that the principles of this invention are applicable to PNP devices also. Further, a plurality of devices can be simultaneously formed on one wafer and subsequently separated into individual wafer dies. Moreover, while this invention has been described in connection with layers of specific resistivities for a selected balance of current and voltage characteristics, it is equally applicable to devices with layers of other resistivities where a different balance of current and voltage characteristics is desired. Analogously, the thicknesses for the various strata in this device can be modified to obtain a different balance of current and voltage characteristics.

We claim:

1. A high voltage and high current integrated circuit of cascaded common collector mesa emitter transistors and bleeder resistors that resists secondary breakdown comprising a wafer of a high resistivity semiconductive material of one conductivity type having two major faces and a circumferential edge surface between said faces, a first lower resistivity stratum in said wafer of said one conductivity type coextensive with one wafer face and intersecting said edge surface, a second stratum in said wafer coextensive with the opposite wafer face, said second stratum of opposite conductivity type and intersecting said edge surface, first and second mesas of said one conductivity type semiconductive material on said second stratum, first and second mutually spaced lower resistivity surface regions of said opposite conductivity type in said second stratum, said first mesa disposed between said first and second lower resistivity surface regions, said second lower resistivity surface region surrounding said second mesa, a first electrode on said first lower resistivity surface region, a second electrode on both said first mesa and said second lower resistivity surface region providing an integral bleeder resistor for said first mesa through said second stratum between said lower resistivity surface regions, a third electrode on both said second mesa and a portion of said second lower resistivity surface region, said second and third electrodes being spaced on said second lower resistivity surface region to provide an integral bleeder resistor for said second mesa along a surface portion of said second lower resistivity surface region, a fourth electrode on the first stratum of said one wafer face, and separate terminal connections, respectively, to said first, third and fourth electrodes serving as base, emitter and collector connections.

2. A high voltage and high current integrated circuit of cascaded common collector mesa emitter transistors and bleeder resistors that resists secondary breakdown comprising a wafer of a high resistivity silicon of one conductivity type having two major faces and a circumferential edge surface betwen said faces, a first lower resistivity stratum in said wafer of said one conductivity type coextensive with one wafer face and intersecting said edge surface, a second stratum in said wafer coextensive with the opposite wafer face, said second stratum of opposite conductivity type and intersecting said edge surface, first and second mesas of said one conductivity type silicon on said second stratum, first and second lower resistivity surface regions of said opposite conductivity type in said second stratum, said first mesa disposed between said first and second lower resistivity surface regions, said second lower resistivity surface region surrounding said second mesa, a first electrode on said first lower resistivity surface region, a second electrode on both said first mesa and said second lower resistivity surface region providing an integral bleeder resistor for said first mesa through said second stratum between said lower resistivity surface regions, a third electrode on both said second mesa and a portion of said second lower resistivity surface region adjacent a side of said second mesa opposite said first mesa, said second and third electrodes being laterally spaced a predetermined distance to provide an integral bleeder resistor for said second mesa along a surface portion of said second lower resistivity surface region, a fourth electrode on said first stratum of said one wafer face, an etch moat on said opposite wafer face spaced inwardly from from said edge surface and circumscribing said mesas, regions, and electrodes, said etch moat spaced outwardly from said mesas and extending down entirely through said second stratum, and separate terminal connections, respectively, to said first, third and fourth electrodes serving as base, emitter and collector connections.

3. A high voltage and high current integrated circuit of cascaded common collector mesa emitter transistors and bleeder resistors that resists secondary breakdown comprising a wafer of high resistivity N-type silicon having two major faces and a circumferential edge surface between said faces, a stratum of P-type silicon coextensive with one face of said wafer and intersecting said edge surface, a first elongated mesa of N-type silicon extending across said wafer face on said P-type stratum dividing said face into first and second P-type portions, a second mesa of N-type silicon on said wafer face wholly within said second P-type portion, a diffused P-type surface enhancement layer throughout the face of said P-type stratum except beneath said mesas, a first electrode on said first P-type portion, a second electrode having a part on said first mesa and a part on said second P-type portion providing a bleeder resistor for said first mesa through said P-type stratum under said first mesa, the part of said second electrode on said second P-type portion extending around and partially encircling said second mesa, a third electrode having a part on said second mesa and a part on said second P-type portion on a side of said second mesa opposite from said first mesa, said second and third electrodes being laterally spaced on said second P-type portion to provide an integral bleeder resistor along the surface of said second P-type, an etch moat on said one wafer face spaced inwardly from said edge surface, and circumscribing said mesas, portions, and electrodes, said etch moat contacting opposite ends of said first mesa and extending down entirely through said P-type stratum of low resistivity N-type silicon coextensive with the opposite face of said wafer, a fourth electrode on said opposite face of said wafer, and separate terminal connections, respectively, to said first, third and fourth electrodes serving as base, emitter and collector terminal connections.

4. A high voltage and high current integrated circuit of cascaded common collector mesa emitter transistors and bleeder resistors that resists secondary breakdown comprising a wafer of a high resistivity N-type silicon having two major faces and a circumferential edge surface, a P-type diffused layer coextensive with one face of said wafer and intersecting said edge surface, first and second N-type silicon mesas on said P-type diffused layer, first and second lower resistivity diffused P-type regions in surface portions of said P-type layer, at least part of said first mesa disposed between said first and second lower resistivity diffused P-type regions, said second lower resistivity P-type region surrounding said second mesa, a first evaporated aluminum electrode on said first lower resistivity diffused P-type region, a second evaporated aluminum electrode having a part on said first mesa and a part on said second lower resistivity diffused P-type region providing an integral bleeder resistor for said first mesa between said lower resistivity diffused P-type regions through said P-type layer, the part of said second electrode on said second diffused P-type region extending around and at least partially encircling said second mesa, a third evaporated aluminum electrode having a part on both said second mesa and a part on said second lower resistivity diffused P-type region on a side of said second mesa opposite from said first mesa, said second and third electrodes being laterally spaced a predetermined distance to provide an integral bleeder resistor for said second mesa along a surface portion of said second lower resistivity diffused P-type region, an etch moat on said opposite wafer spaced inwardly from said edge surface and circumscribing said mesas, regions, and electrodes, said etch moat extending down entirely through said diffused P-type layer, a lower resistivity diffused N-type layer coextensive with the opposite one face and intersecting said edge surface, a fourth electrode on said lower resistivity diffused N-type layer, and separate terminal connections, respectively, to said first, third and fourth electrodes serving as base, emitter and collector connections.

* * * * *